United States Patent [19]

Kaneko et al.

[11] Patent Number: 4,495,780
[45] Date of Patent: Jan. 29, 1985

[54] COOLING METHOD AND APPARATUS FOR HERMETIC TYPE CONTROL BOX

[75] Inventors: Tomonori Kaneko; Shunji Mori; Tetsuo Ichikawa, all of Hitachi; Yoichi Hiroki, Hitachiota; Takashi Kariya, Hitachi, all of Japan

[73] Assignee: Hitachi, Ltd., Tokyo, Japan

[21] Appl. No.: 447,798

[22] Filed: Dec. 8, 1982

[30] Foreign Application Priority Data

Dec. 9, 1981 [JP] Japan .................... 56-196849

[51] Int. Cl.³ .................... F25B 41/00; H05K 7/20
[52] U.S. Cl. .................... 62/229; 62/209; 236/91 A; 174/15 R; 313/13; 361/381
[58] Field of Search ............ 62/229, 3, 180, 209; 236/49, 91 R, 91 A, 91 G; 165/28; 174/15 R, 16 R; 313/13; 315/117; 361/381, 382, 383, 384

[56] References Cited

U.S. PATENT DOCUMENTS

| | | | |
|---|---|---|---|
| 2,187,011 | 1/1940 | Braden | 361/382 X |
| 2,646,931 | 7/1953 | Suter | 313/13 X |
| 4,245,481 | 1/1981 | McDermott | 62/180 X |
| 4,259,843 | 4/1981 | Kausch | 62/3 |
| 4,352,274 | 10/1982 | Anderson et al. | 62/229 |

FOREIGN PATENT DOCUMENTS 56-19758  5/1981  Japan .

Primary Examiner—Harry Tanner
Attorney, Agent, or Firm—Antonelli, Terry & Wands

[57] ABSTRACT

Method and apparatus for controlling the cooling of a hermetic type control box accommodating therein electronic apparatus by means of a cooling system. A cooling member of the cooling system is disposed at an upper portion of a hermetically closed chamber in which the electronic apparatus is housed. On the basis of measurements of intra-box temperature and extra-box temperature, control is so performed that the intra-box temperature is maintained higher than the extra-box temperature by a predetermined value when the cooling is being effected within the control box by means of the cooling system.

6 Claims, 7 Drawing Figures

FIG. 2
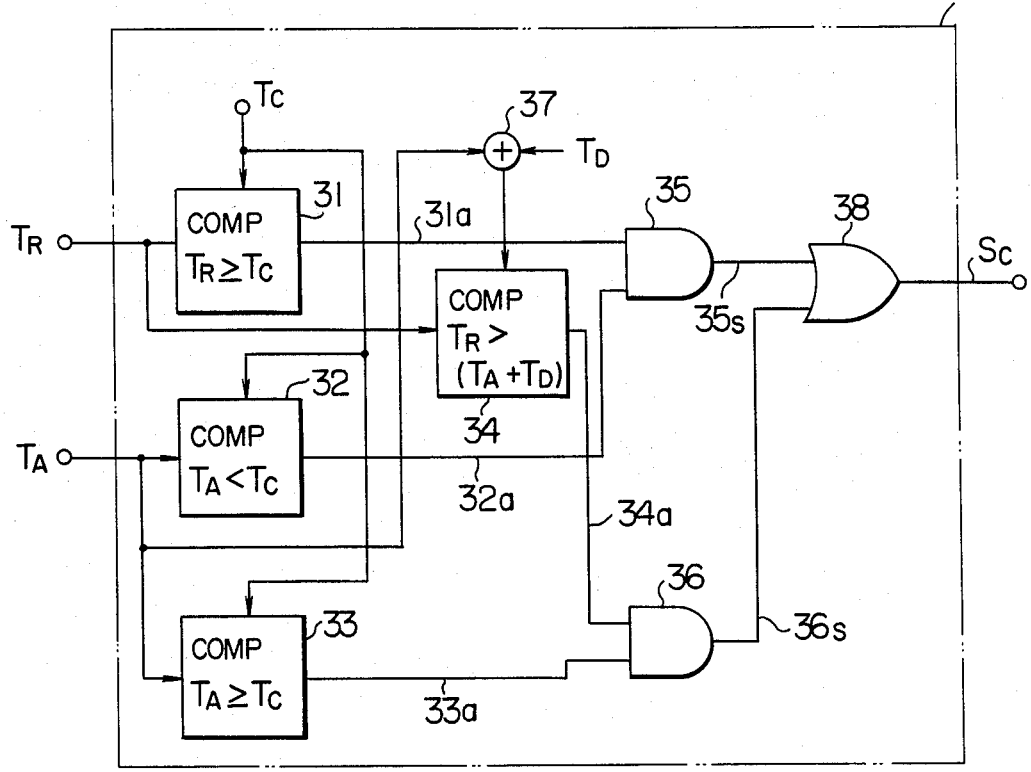
FIG. 4A
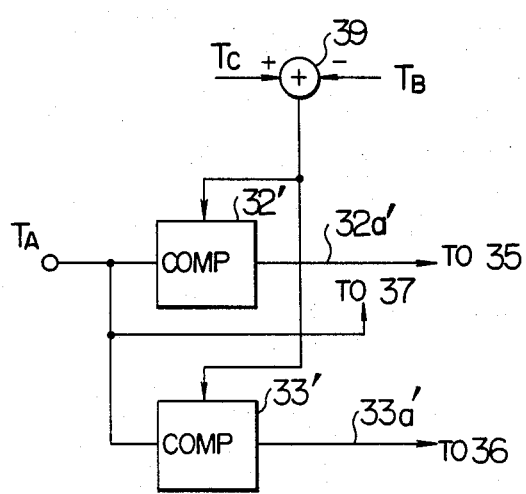
FIG. 4B
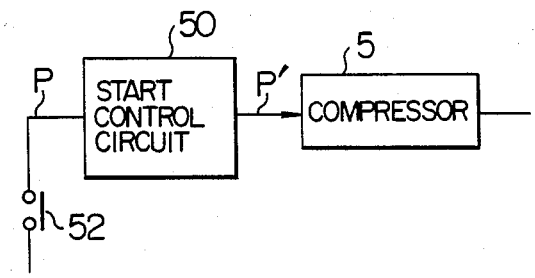
FIG. 4C
FIG. 4D
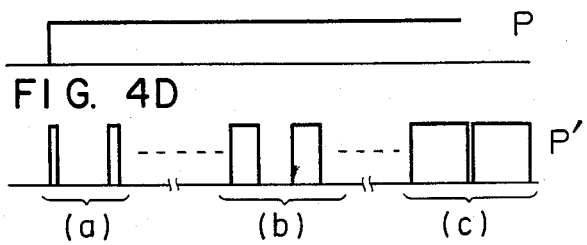

4,495,780

COOLING METHOD AND APPARATUS FOR HERMETIC TYPE CONTROL BOX

BACKGROUND OF THE INVENTION

1. Field of the Invention

The present invention relates to a method of cooling devices accommodated within a hermetically closed control box or cabinet. The invention also concerns an apparatus for carrying out the method.

In the course of remarkable progress and diversification of electronic devices or apparatus, there arises increasingly the demand for a hermetic type control box (i.e. hermetically closed box) which can protect electronic devices or apparatus accommodated therein from environmental influences such as dust, water and corroding action of ambient gases. In this conjunction, providing such a control box is made difficult by the problem of temperature rise within the closed box caused by heat generation of the electronic devices or apparatus.

The present invention concerns the cooling for a hermetic type control box and in particular a method and apparatus for controlling the cooling of a hermetic type control box incorporating a cooling system.

2. Description of the Prior Art

Heretofore, several attempts have been proposed concerning heat dissipation of a hermetic type control box.

One of them resides in a heat conducting method according to which a material having a high thermal conductivity is made use of for conducting heat from a heat generating portion to a heat sink for dissipation. This method is certainly very convenient and adopted in many practical applications. However, it suffers a disadvantage that restrictions are inevitably imposed on the package of the electronic devices and the structure of the control box when a satisfactory thermal conduction is to be realized, involving a complicated structure of the whole equipment and much time for manufacturing.

In another proposal which seems to solve the above problem a fan is mounted within the hermetic type control box, whereby heat generated by the electronic devices is carried away by air flow produced by the fan. The air flow is directed perpendicularly to the inner wall of the box so as to be recirculated within the box by the fan. Although this solution eliminates the need for the heat conducting material, the cooling action cannot be satisfactorily attained when the ambient temperature is high. Further, heat generation by the fan itself can not be neglected. When the ambient temperature rises, for example, beyond 30° C. in mid summer, the permissible temperature rise of the electronic devices is correspondingly limited, to a disadvantage.

As another attempt for cooling a hermetic type control box, it has been proposed to effect heat exchange between the interior of the box where the electronic devices are housed and the surroundings, to thereby cause the air cooled by the ambient atmosphere to circulate within the hermetically closed box where the electronic devices are accommodated. Reference may be made to Japanese Patent Publication No. 19758/81, published May 9, 1981. However, the cooling effect also depends on the ambient temperature as is in the case of the aforementioned proposal. In other words, this proposal does not solve the problem that the permissible temperature rise of the electronic devices is reduced when the ambient temperature is high, thereby restricting the packaging density of the electronic devices within the box.

As other approaches, it is conceivable to make use of the Peltier effect or immerse the electronic devices in an insulation coolant such as, for example, in a bath of insulation oil as adopted in oil-filled transformers. However, at present, these cooling systems are not yet widely adopted in the field of the hermetic type control box. In the former case, a power source of a relatively large capacity will be required, while the structure of the box or housing is considerably complicated in the latter case, giving rise to another problem.

SUMMARY OF THE INVENTION

An object of the present invention is to provide a cooling method and apparatus for a hermetic type control box.

Another object of the present invention is to provide a cooling method and apparatus for a hermetic type control box which can assure improved cooling effect independent of variations in the ambient temperature.

According to an aspect of the present invention, a cooling means is provided at a top portion in a hermetically closed chamber or box, whereby air cooled by the cooling means is circulated within the closed chamber or box in which electronic devices are housed.

According to another aspect of the invention, intra-box temperature prevailing within a hermetically closed chamber in which electronic devices are housed is measured, whereby the cooling system is driven when the measured temperature exceeds a predetermined value to cool the circulated air and hence the electronic devices.

According to a further aspect of the invention, the ambient temperature (i.e. extra-box temperature) is measured to control the operation of the cooling system so that the intra-box temperature (i.e. the temperature in the closed box or chamber) be equal to or higher than the ambient or extra-box temperature.

BRIEF DESCRIPTION OF THE DRAWINGS

FIG. 2 is a circuit diagram of a control apparatus according to an embodiment of the invention;

FIGS. 4A and 4B show, respectively, circuit diagrams of other embodiments of the invention; and FIGS. 4C and 4D are signal diagrams to illustrate operations of the apparatus shown in FIG. 4B.

DESCRIPTION OF THE PREFERRED EMBODIMENTS

Figure 1:
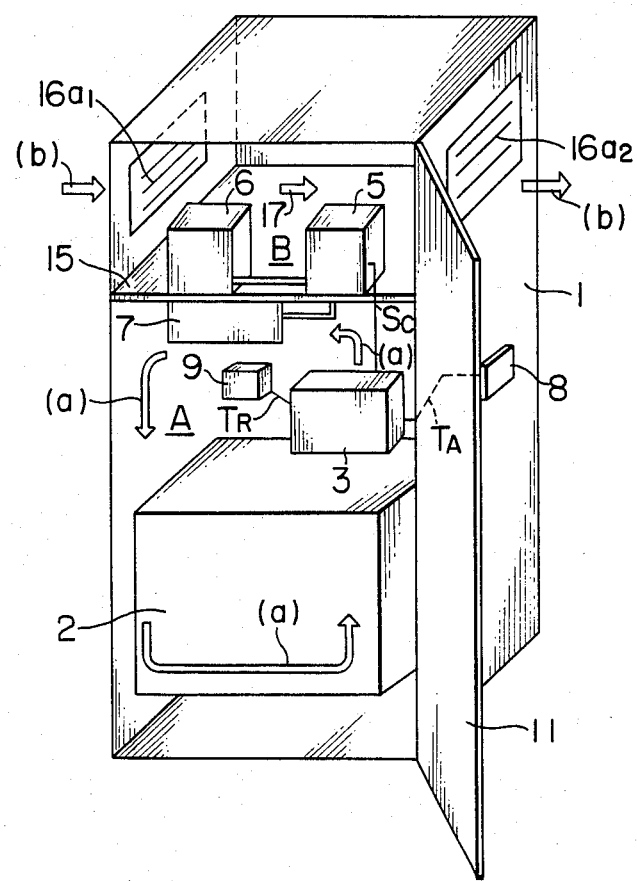
FIG. 1 is a schematic view showing a structure of a hermetic type control box to which the present invention is applied.

FIG. 1 shows in a schematic perspective view a structure of a hermetic type control box according to an embodiment of the present invention in the state where a door 11 is opened to allow access to the interior of the control box for maintenance or the like services.

Referring to FIG. 1, the interior of the hermetic type control box 1 is divided by a partition wall 15 into a lower chamber A and an upper chamber B. The lower chamber A contains therein electronic instruments or apparatus 2 and is put to the hermetically closed state when the door 11 is closed. In the case of the illustrated embodiment, there are further disposed within the lower chamber A a temperature detector 9 for detecting the temperature $T_R$ in the chamber A (this temperature $T_R$ is referred to as the intra-box temperature) and a temperature control unit 3. An evaporator 7 which constitutes the intrinsic cooling section of a cooling system is mounted on the lower surface of the partition wall 15.

On the other hand, the upper chamber B accommodates therein a compressor 5 and a condenser 6 both constituting parts of the cooling system where a coolant is made use of. There are provided in side walls of the upper chamber B ventilating apertures $16_{a1}$ and $16_{a2}$ through which the upper chamber B is communicated with the ambient atmosphere. A detector 8 for detecting the temperature $T_A$ outside the control box (i.e. the ambient temperature referred to as the extra-box temperature) is mounted on an outer wall of the control box.

In the control box of the structure described above, the coolant used in the cooling means is compressed by the compressor 5 and condensed by the condenser 6. Compression of the coolant naturally entails heat generation in the coolant itself which is however dispelled by cooling air flowing from outside the box through the upper chamber B by way of the ventilating apertures $16_{a1}$ and $16_{a2}$ as indicated by hollow arrows (b). Condensate of the coolant is vaporized being subjected to decompression in the evaporator 7, whereupon heat present in the surrounding area of the evaporator 7 is consumed for the vaporization, thereby bringing about a cooling action. The air cooled under the cooling action is caused to circulate within the closed lower chamber A as indicated by arrows (a) to cool the electronic devices or apparatus 2. Since the electronic unit 2 is cooled in this manner without being accompanied by the flowing-in of the ambient air, unexpected failure of the packaged electronic devices due to the harmful materials contained in the ambient air and in particular corrosion of pins of LSI's (Large Scale Integrated Circuits) can be positively excluded.

According to the present invention, the cooling operation by the cooling system is not continuously carried out, but effected in such a manner that the cooling system is activated when the intra-box temperature $T_R$ attains a predetermined temperature $T_C$ or exceeds the $T_C$ (i.e. when $T_R \geq T_C$) and this is based on the fact that in the case of low extra-box temperature, for example, even though electronic devices or apparatus are hermetically closed, heat dissipating action can be expected to some extent due to the difference between the intra-box temperature and the extra-box temperature.

A control circuit used to this end is shown in a block diagram of FIG. 2 in which reference numerals 31 to 34 denote comparators, while numerals 35 and 36 denote logical product or AND circuits, respectively, and a numeral 38 denotes a logical sum circuit OR. The detected intra-box temperature $T_R$ and the detected extra-box temperature $T_A$ are supplied to the comparators 31 and 32, respectively. When the intra-box temperature $T_R$ is equal to or higher than the predetermined set temperature $T_C$, the comparator 31 produces a signal 31a. On the other hand, the comparator 32 produces an output signal 32a when the extra-box temperature is lower than the set temperature, i.e. $T_A < T_C$. Both the output signals 31a and 32a are ANDed by the AND circuit 35 to produce a logical product signal 35s which is outputted as a signal $S_c$ through the OR gate 38 to be utilized for activating the compressor 5 of the cooling system.

There arises no problem in the control mentioned above so far as $T_A$ is lower than $T_C$. However, the extra-box temperature $T_A$ varies significantly throughout the seasons, bringing about such situation in which $T_A$ is higher than $T_C$ in dependence on the set value of $T_C$. When the reference temperature $T_C$ is set, for example, at 30° C., there may happen the situation where the extra-box temperature $T_A$ exceeds the reference temperature $T_C$.

However, so far as $T_R$ is not lower than $T_C$ and $T_A$ is lower than $T_C$, the cooling system is driven and as a result of which the temperature condition tnat $T_R < T_A$ is reached. Under this condition, a frosting phenomenon may take place, to exert unwantedly adverse influence to the electronic devices in the control box. This problem of the frosting phenomenon can be successfully solved by the invention in the manner described below.

Referring to FIG. 2, the comparator 33 produces an output signal 33a when $T_A \geq T_C$. On the other hand, the comparator 34 produces an output signal 34a when $T_R > T_A + T_D$. When the condition for logical product of both signals 34a and 33a is met, a signal 36s is produced by the AND circuit 36. Since the signal 32a is logic "0" when $T_A \geq T_C$, the AND circuit 35 is then blocked to produce no output signal 35s. In this way, the intra-box temperature $T_R$ is so controlled as to be higher than the extra-box temperature $T_A$ by $T_D$, when $T_A \geq T_C$, whereby the frosting phenomenon is prevented from occurrence.

The temperature difference $T_D$ mentioned above should be set at an optimal value in consideration of humidity of the ambient air and the atmospheric pressure. It has been experimentally established that the frosting phenomenon can be suppressed when the temperature difference $T_D$ is set at 2° C. to 3° C. or at ca. 5° C. in usual cases.

Figure 3:
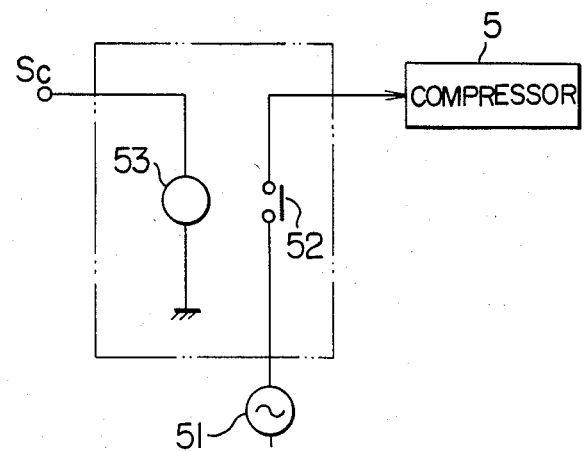
FIG. 3 is a circuit diagram showing an example of a control circuit for controlling the starting operation of a cooling system.

On the other hand, the compressor 5 is operated under the control of a circuit shown in FIG. 3 in response to an input signal $S_c$ supplied from the temperature control apparatus. Referring to FIG. 3, the compressor 5 is connected to a driving power supply source 51 through an ON/OFF switch 52. Arrangement is made in such a manner that the switch 52 is closed when a coil 53 for the switch 52 is energized by the signal $S_c$ outputted by the temperature control apparatus. The compressor 5 is thus driven when the switch 52 is closed in response to the signal $S_c$ to thereby effect the cooling cycle in the lower chamber A of the control box.

In the case of exemplary embodiment shown in FIG. 2, there may happen such a situation that the output signal 31a of the comparator 31 is logic "1" when $T_R = T_C$ while $T_A$ approximates closely to $T_C$ although $T_A < T_C$. In this case, there may occur the frosting phenomenon in dependence on the condition of the ambient air. To deal with this problem, the value of the signal $T_C$ applied to the comparators 32 and 33 should be corrected. An example of the circuit arrangement for correcting the signal $T_C$ is shown in FIG. 4A. Referring to FIG. 4A, a reference numeral 39 denotes an adder whose output signal is represented by value $T_C - T_B$, where $T_B$ represents a correcting temperature of factor for the temperature signal $T_C$ and may be selected equal to $T_D$. With this arrangement, the output signal 32'a of the comparator 32' is ON or logic "1" when $T_A < T_C - T_B$, while the output signal 33'a of the comparator 33' is logic "1" when $T_A \geq T_C - T_B$. When the correcting factor $T_B$ is set equal to $T_D$, the cooling system remains inoperative if $T_A$ is not lower than $T_C - T_D$ even if $T_R$ is not lower than $T_C$.

It should further be mentioned that when the cooling system is instantaneously turned on, there may take place the frosting phenomenon in the evaporator 7 due to rapid cooling. To prevent such frosting phenomenon, it is preferred to provide a start control circuit 50 to thereby increase only progressively the electric power supplied to the compressor 5 from the power supply source 51 toward a full power level by correspondingly varying the duty cycle of the power signal with the aid of a circuit arrangement shown in FIG. 4B. For example, when the power-on signal such as the one shown in FIG. 4C is applied, the compressor 5 should preferably be started by varying the duty cycles of the power supply in a manner illustrated in FIG. 4D. In this connection, it should be noted that FIG. 4D shows merely schematically the progressive variation in the duty cycle and does not imply that the power supply is made from a D.C. power source. The control of the duty cycle may be effected by adopting the gate control of a thyristor for practical applications.

In the case of the embodiment shown in FIG. 2, the cooling system is operated only when both of the conditions that $T_R \geq T_C$ and that $T_A < T_C$ are simultaneously met. However, since $T_A$ is usually smaller than $T_C$, the cooling system may be operated in dependence on the result of only the decision as to whether $T_R \geq T_C$. In that case, the circuit configuration can be correspondingly simplified. The situation in which $T_A \geq T_C$ and $T_R < T_C$ should rather be considered as an abnormal state. In that case, the cooling system should preferably be prevented from inadvertent activation. Accordingly, the driving of the cooling system in dependence on the logical product of the output signal 31a from the comparator 31 and the output signal 32a of the comparator 32 can assure the normal operation of the cooling system.

In the structure shown in FIG. 1, the temperature control apparatus 3 is disposed in the hermetically closed portion in view of the fact that major parts of the temperature control apparatus also are constituted by electronic parts which thus should be positioned in the hermetically closed portion to assure the increased reliability of the control apparatus.

As described hereinbefore, the cooling system is driven when $T_R > T_A + T_D$ in the case of $T_A \geq T_C$. This means that the intra-box temperature $T_R$ is controlled in following the signal $(T_A + T_D)$, whereby frosting phenomenon is prevented from occurring due to the operation of the cooling system.

We claim:

1. An apparatus for cooling a hermetic type control box accommodating therein electronic apparatus with the aid of a cooling apparatus, comprising:
    a cooling section of said cooling apparatus disposed at an upper portion of a hermetically closed portion of said control box;
    an intra-box temperature detector for detecting an intra-box temperature ($T_R$) within said control box;
    a first comparator for comparing said detected intra-box temperature ($T_R$) with a predetermined set temperature ($T_C$) to thereby produce an output signal when said intra-box temperature ($T_R$) is not lower than said predetermined set temperature ($T_C$),
    an extra-box temperature detector for detecting an extra-box temperature ($T_A$) outside of said control box;
    a second comparator comparing said detected extra-box temperature ($T_A$) with said predetermined set temperature ($T_C$) to produce an output signal when said extra-box temperature ($T_A$) is lower than said predetermined set temperature ($T_C$);
    a first AND gate for determining a logical product of the output signals of said first and second comparators, said cooling apparatus being driven in response to the output signal of said first AND gate;
    a third comparator for producing an output signal when said extra-box temperature ($T_A$) is not lower than said predetermined set temperature ($T_C$);
    a fourth comparator for producing an output signal when said detected intra-box temperature ($T_R$) becomes higher than said extra-box temperature ($T_A$) by a predetermined temperature ($T_D$); and
    a second AND gate for producing an output signal when the logical product of the output signals of said third and fourth comparators is valid, wherein said cooling apparatus is driven in response to the output signal of said second AND gate.

2. A method of cooling a hermetic type control box including a hermetically closed portion for housing an electronic device and a cooling apparatus for cooling said hermetically closed portion, a cooling section of said cooling apparatus being disposed in said hermetically closed portion of said control box, comprising the step of detecting an intra-box temperature ($T_R$) of said hermetically closed portion, detecting an extra-box temperature ($T_A$) outside of said control box, comparing said extra-box temperature ($T_A$) with a predetermined temperature ($T_C$), and when said extra-box temperature ($T_A$) is less than said predetermined temperature ($T_C$) driving said cooling apparatus to effect cooling within said box only when said intra-box temperature ($T_R$) is equal to or greater than said predetermined temperature ($T_C$), and when said extra-box temperature ($T_A$) is equal to of greater than said predetermined temperature ($T_C$) driving said cooling apparatus to effect cooling within said box only when said intra-box temperature ($T_R$) is greater than $T_A + T_D$ where $T_D$ is a predetermined temperature, whereby frosting within said box can be avoided.

3. A method according to claim 2, wherein said predetermined temperature ($T_C$) is a predetermined set temperature for the intra-box temperature.

4. A method according to claim 2, wherein said predetermined temperature ($T_C$) is a predetermined set temperature for the intra-box temperature minus a predetermined correcting temperature ($T_B$).

5. A method according to claim 4, wherein said predetermined correcting temperature ($T_B$) is equal to said predetermined temperature $T_D$.

6. A method of cooling a hermetic type control box including a hermetically closed portion housing an electronic device and a cooling apparatus for cooling said hermetically closed portion, a cooling section of said cooling apparatus being disposed in said hermetically closed portion of said control box, comprising the steps of:
    detecting an intra-box temperature ($T_R$) of said hermetically closed portion and an extra-box temperature ($T_A$) outside of said control box and issuing a first control signal when said intra-box temperature ($T_R$), said extra-box temperature ($T_A$) and a predetermined temperature ($T_D$) satisfy a relationship $T_R > T_A + T_D$;

comparing said extra-box temperature ($T_A$) with a predetermined temperature ($T_C$) and issuing a second cooling control signal when said extra-box temperature ($T_A$) is equal to or greater than said predetermined temperature ($T_C$); and driving said cooling apparatus to effect cooling within said box when both said first and second control signals are issued whereby frosting within said box can be avoided.

* * * * *